United States Patent [19]

Haque

[11] 4,431,971

[45] Feb. 14, 1984

[54] DYNAMIC OPERATIONAL AMPLIFIER

[75] Inventor: Yusuf A. Haque, San Jose, Calif.

[73] Assignee: American Microsystems, Incorporated, Santa Clara, Calif.

[21] Appl. No.: 293,744

[22] Filed: Aug. 17, 1981

[51] Int. Cl.³ .............................................. H03F 3/45
[52] U.S. Cl. .................................. 330/253; 330/261; 330/297; 330/107
[58] Field of Search ............... 330/253, 261, 107, 296, 330/297; 307/246, 355, 296 A; 320/1

[56] References Cited

U.S. PATENT DOCUMENTS 4,179,665 12/1979 Gregorian ........................... 330/107

OTHER PUBLICATIONS

Hosticka, Dynamic CMOS Amplifiers, IEEE Journal of Solid State Circuits, vol. SC-15, No. 5, Oct. 1980.

Primary Examiner—James B. Mullins
Assistant Examiner—Gene Wan
Attorney, Agent, or Firm—Alan H. MacPherson; Steven F. Caserza; Richard Franklin

[57] ABSTRACT

A unique dynamic operational amplifier is constructed utilizing a switched capacitor (25) as the biasing means, wherein the switched capacitor biasing means is capable of effectively doubling the power supply voltage supplied to the dynamic operational amplifier, thus greatly extending the range of the input voltage ($V_{IN}$) and output voltage ($V_{OUT}$) of the dynamic operational amplifier.

11 Claims, 3 Drawing Figures

DYNAMIC OPERATIONAL AMPLIFIER

BACKGROUND OF THE INVENTION

1. Field of the Invention

This invention relates to operational amplifiers and, more specifically, to a dynamic operational amplifier.

2. Description of the Prior Art

Dynamic operational amplifiers utilizing dynamic differential stages have been described by Copeland and Rabaey, "Dynamic Amplifier for MOS Technology", Electronics Letters, Volume 15, Pages 301-303, May 1979, and by Hosticka, "Dynamic CMOS Amplifiers", IEEE Journal of Solid-State Circuits, Volume SC-15, No. 5, 1980. Such dynamic amplifiers utilize dynamic (i.e., non-constant) biasing. The dynamic biasing used causes the amplifier to be biased at a large current in the beginning of the voltage differential cycle, thus causing the amplifier to exhibit a large gain-bandwidth product, thus allowing the output voltage of the amplifier to slew toward the desired output voltage at a very rapid rate. The dynamic biasing continuously reduces the biasing current, thus shifting the amplifier from the operating region of large gain-bandwidth product into the region with large low frequency voltage gain. Thus, the amplifier is able to very accurately slew to the correct output voltage at the end of the differential cycle.

The dynamic CMOS differential stages disclosed by Copeland and Hosticka require a positive supply voltage $V_{DD}$ as well as a negative supply voltage $V_{SS}$. Thus, the dynamic operational amplifiers of the prior art are capable of accurately responding to a positive input voltage as great as $(V_{DD}-V_T)$, where $V_T$ is the threshold voltage of the differential input transistors. Similarly, prior art dynamic operational amplifiers are capable of accurately responding to a negative input voltage of as little as $(V_{SS}+V_T)$.

In many applications, it is desired to obtain a wide range of output voltages from a dynamic CMOS operational amplifier in response to a wide range of input voltages. In many instances, the available supply voltages are very limited. For example, in many microprocessor applications, the standard available supply voltage is $V_{DD} = +5$ volts, and $V_{SS} = 0$ volts (ground). Utilizing these voltages in conjunction with the dynamic CMOS operational amplifiers of Hosticka and Copeland, the maximum positive input voltage will be equal to $(V_{DD}-V_T)$, and the maximum negative input voltage will be $(0+V_T)$. The maximum positive and negative output voltages from these prior art dynamic operational amplifiers will approach $V_{DD}$ and $V_{SS}$ (ground). Thus, in many applications the prior art dynamic CMOS operational amplifiers may not be used to provide a wide range of output voltages in response to a wide range of input voltages unless an additional power supply is utilized. The use of additional power supplies is of course expensive, and in many applications, so expensive as to prohibit their use.

SUMMARY

In accordance with this invention, the biasing capacitor utilized in a dynamic operational amplifier is first charged between the positive supply voltage and the negative supply voltage, and subsequently has its positively charged plate connected to the negative supply voltage, and its negatively charged plate connected to the differential input transistor pair. In this manner, the supply voltage applied across the differential input transistor pair and associated load devices is effectively doubled, without a substantial increase in power consumption. Thus, the dynamic operational amplifier of this invention is capable of accurately responding to a wide range of input voltages, and the output voltage of one embodiment of the dynamic operational amplifier of this invention has a range which greatly exceeds the output voltage range of prior art dynamic operational amplifiers utilizing similar power supply voltages. Furthermore, the output voltage of the dynamic operational amplifier of this invention may actually range both positive and negative with respect to ground, even when no voltage supply less than ground is connected to the circuit.

DESCRIPTION

Figure 1:
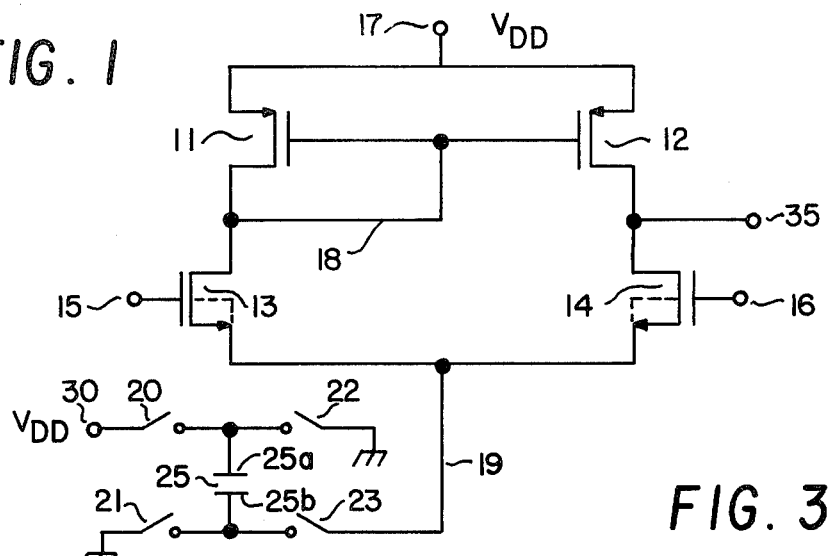
FIG. 1 is a schematic diagram of the dynamic operational amplifier of this invention which is capable of operating during one phase of a non-overlapping two phase clock signal.

FIG. 1 shows a schematic diagram of one embodiment of this invention. N channel input transistor 13 and N channel input transistor 14 form the differential input pair of transistors of this circuit. In circuits where the output signal appearing on output terminal 35 is not inverted by additional stages (not shown), the gate lead 15 of transistor 13 serves as the non-inverting input lead and gate lead 16 of transistor 14 serves as the inverting input lead of the dynamic operational amplifier of this invention. P channel MOSFET devices 11 and 12 serve as load devices, although other load devices may be used, such as diffused resistors, for example, when the operational amplifier of this invention is to be formed as a monolithic integrated circuit device. The sources of P channel MOSFETs 11 and 12 are connected in common to a positive supply voltage $V_{DD}$ applied at node 17. The gates of P channel MOSFETs 11 and 12 are connected in common, and in turn connected by the lead 18 to the drain of MOSFET 11. The drain of MOSFET 11 is connected to the drain of N channel MOSFET 13, and the drain of MOSFET 12 is connected to the drain of N channel MOSFET 14. The sources of MOSFETs 13 and 14 are connected in common to lead 19.

The negative supply voltage, equal to $-V_{DD}$, is generated by capacitor 25 and switches 20 through 23 and applied via the lead 19 to the sources of MOSFETs 13 and 14. Thus, the positive supply voltage applied to node 17 is equal to $V_{DD}$, and the negative supply voltage applied to lead 19 is equal to $-V_{DD}$. As contrasted with prior art operational amplifiers utilizing static biasing, the dynamic operational amplifier constructed in accordance with this invention results in a substantial decrease in power consumption.

Figure 3:
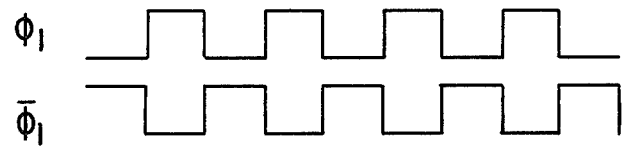
FIG. 3 is a representation of the non-overlapping two phase clock signal utilized by this invention.

Clocks $\phi_1$ and $\overline{\phi}_1$ comprise two non-overlapping clock signals, as depicted in FIG. 3. Switches 20 and 21 are controlled by clock $\phi_1$ such that switches 20 and 21 are closed when clock $\phi_1$ is high and switches 20 and 21 are open when clock $\phi_1$ is low. Similarly, switches 22 and 23 are controlled by clock $\overline{\phi}_1$ such that switches 22 and 23 are closed when clock $\overline{\phi}_1$ is high and switches 22 and 23 are open when clock $\overline{\phi}_1$ is low.

The negative supply voltage is generated as follows. During the first clock phase, $\phi_1$ is high, $\overline{\phi}_1$ is low, switches 20 and 21 close, and switches 22 and 23 open. This connects capacitor 25 between $V_{DD}$ (at node 30) and ground. This causes capacitor 25 to be charged to $V_{DD}$. During the second clock phase, $\phi_1$ is low and $\overline{\phi}_1$ is high, switches 20 and 21 open, and switches 22 and 23 close. Thus, the positively charged plate 25a (which has been charged to $V_{DD}$) of capacitor 25 is connected through switch 22 to ground. Similarly, the negatively charged plate 25b (which has been charged to ground) of capacitor 25 is connected via switch 23 to lead 19. Thus, the lead 19 is at a voltage equal to $-V_{DD}$. In this manner, the total voltage appearing across the differential stage comprising MOSFETs 11, 12, 13 and 14 is equal to $V_{DD}-(-V_{DD})=2V_{DD}$, or twice the supply voltage applied to the circuit. The dynamic operational amplifier of this invention is capable of responding accurately to input signals ($V_{IN}$) ranging from ($V_{DD}-V_{TP}$) to ($-V_{DD}+V_{TN}$), where $V_{TN}$ is the threshold voltage of MOSFETs 13 and 14 and $V_{TP}$ is the threshold voltage of MOSFETs 11 and 12. Within this range of input signals the output voltage $V_{OUT}$ available on node 35 will range from a maximum of approximately ($V_{DD}-V_{TP}$) to a minimum of approximately $-V_{DD}$.

The value of capacitor 25 required for proper operation of the dynamic differential amplifier of this invention is on the order of a few picofarads, and is easily provided by well known techniques when the dynamic operational amplifier of this invention is constructed as a single integrated circuit device. Of importance, the capacitance value of capacitor 25 must be substantially increased when the output signal on terminal 35 is to be connected to an output stage (not shown) which requires a substantial amount of current to be drawn from the $-V_{DD}$ voltage source comprising capacitor 25. However, the output stage (not shown) may be supplied by a negative voltage source other than capacitor 25. Furthermore, the output signal on output terminal 35 need not be amplified by additional circuitry in many instances, when the output signal on terminal 35 is capable of driving such additional circuitry without the need for amplification.

In a second embodiment of this invention, output terminal 35 is connected to an output amplifier stage (not shown) which is powered by $V_{DD}$ and $V_{SS}=$ground. The differential stage (FIG. 1) provides an accurate signal on node 35 to the output amplifier stage (not shown) within the range of input signals $(-V_{DD}+V_{TN})\leq V_{IN}\leq(V_{DD}-V_{TP})$, as previously described. However, the output amplifier stage is capable of providing an output signal $V_{OUT}$ within the range $V_{SS}=0$ volts $\leq V_{OUT}\leq V_{DD}$. Thus, the output amplifier stage provides a so-called "clipped" output signal, with $V_{OUT}$ never being equal to less than zero volts. In this second embodiment of the invention, the output signal from the output amplifier stage provides an accurate output signal over the range of input signals $0\leq V_{IN}\leq(V_{DD}-V_{TP})$, as compared with prior art operational amplifiers which, utilizing similar supply voltages, provide an accurate output signal over the range of input signals $V_{TN}\leq V_{IN}\leq(V_{DD}-V_{TP})$. For typical operational amplifiers which use $V_{DD}=5$ volts and comprise transistors having threshold voltages $V_{TN}=V_{TP}=1$ volt, the output signals of prior art operational amplifiers are accurate over an input signal range of 1-4 volts, as contrasted with the range of 0-4 volts (a 33% increase) provided by this invention.

The frequency of operation of clocks $\phi_1$ and $\overline{\phi}_1$ is at least twice the frequency of the input signal applied to input leads 15 and 16 and preferably as high as possible. Typically the clock frequency is approximately ten times the frequency of the input signal, when the input signal is an audio frequency signal.

Because the circuit of FIG. 1 is disconnected from the generated negative supply voltage ($-V_{DD}$) during the first clock phase of the two phase clock signal ($\phi_1$ high and $\overline{\phi}_1$ low) and is only connected to the generated negative supply voltage ($-V_{DD}$) during the second clock phase of the two phase clock signal ($\phi_1$ low and $\overline{\phi}_1$ high), the circuit of FIG. 1 is capable of providing an output voltage $V_{OUT}$ on node 35 in response to input voltages applied on nodes 15 and 16 only during the second clock phase ($\phi_1$ low and $\overline{\phi}_1$ high). Thus, the duty cycle of the circuit of FIG. 1 is less than 100%, and the actual value of the duty cycle is equal to the duty cycle of the second clock signal $\overline{\phi}_1$.

Figure 2:
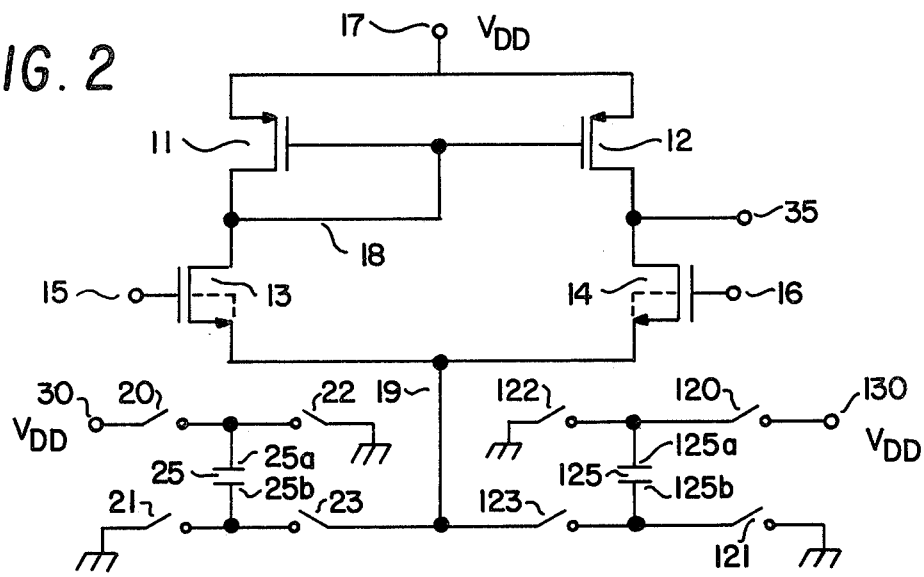
FIG. 2 is a schematic diagram of the dynamic operational amplifier of this invention which is capable of operating during both clock phases of a non-overlapping two phase clock signal.

In many instances, it is necessary or desirable to utilize a dynamic CMOS differential stage having a 100% duty cycle. The circuit of FIG. 2 is an embodiment of this invention which offers the same advantages as the embodiment of FIG. 1, in addition to a 100% duty cycle. MOSFETs 11, 12, 13 and 14 of the embodiment of FIG. 2 operate in identical manner as their counterparts in the embodiment of FIG. 1. Similarly, capacitor 25 and switches 20 through 23 of the embodiment of FIG. 2 operate in identical manner with their identically numbered counterparts in the embodiment of FIG. 1. However, in the embodiment of this invention shown in FIG. 2, an additional capacitor 125 and additional switches 120 through 123 are utilized. Switches 122 and 123 are controlled by clock $\phi_1$, such that switches 122 and 123 are closed when clock $\phi_1$ is high and switches 122 and 123 are open when clock $\phi_1$ is low. Similarly, switches 120 and 121 are controlled by clock $\overline{\phi}_1$, such that switches 120 and 121 are closed when clock $\overline{\phi}_1$ is high and switches 120 and 121 are open when clock $\overline{\phi}_1$ is low. During the second clock phase ($\phi_1$ low and $\overline{\phi}_1$ high) when capacitor 25 is connected to lead 19, thus providing a negative supply voltage to MOSFET 13 and 14, switches 120 and 121 are closed, and switches 122 and 123 are open. In this manner, plate 125a of capacitor 125 is connected through switch 120 to the positive supply voltage $V_{DD}$ applied to node 130, and capacitor plate 125b is connected through switch 121 to ground, thus charging capacitor 125 to $V_{DD}$. During the first clock phase ($\phi_1$ high and $\overline{\phi}_1$ low) when capacitor 25 is charging and thus disconnected from lead 19, switches 120 and 121 open and switches 122 and 123 close. Thus, capacitor plate 125a (previously charged to $V_{DD}$) of capacitor 125 is connected through switch 122 to ground, and capacitor plate 125b (previously charged to ground) of capacitor 125 is connected through switch 123 to lead 19. In this manner, $-V_{DD}$ is applied from capacitor 125 to lead 19 during the first clock phase ($\phi_1$ high and $\overline{\phi}_1$ low). Thus, capacitor 125 provides a negative voltage to lead 19 during each first clock phase ($\phi_1$ high, $\overline{\phi}_1$ low) and capacitor 25 supplies a negative voltage to lead 19 during each second clock phase ($\phi_1$ low and $\overline{\phi}_1$ high). In this manner, a negative voltage $-V_{DD}$ is always applied to lead 19, thus providing a dynamic operational amplifier in accordance with this invention having a 100% duty cycle, thus being able to continuously provide an output signal on node 35 in response to the input signals applied to inverting input lead 15 and non-inverting input lead 16.

In this manner, operational amplifiers may be constructed in accordance with this invention which are capable of providing an output signal which may be either positive or negative, although the operational amplifier is powered by only a single voltage source. Furthermore, operational amplifiers constructed in accordance with this invention provide an accurate output signal in response to a wider range input signals as compared with prior art operational amplifiers.

The circuits described in this specification are merely illustrative of this invention and are not to be interpreted as limitations on the invention. Many specific embodiments can be realized by those skilled in the art in accordance with the teachings of this invention, without detracting from the spirit and scope of this invention.

I claim:

1. A dynamic operational amplifier comprising:
   a first and a second load device, each having first and second leads, said first leads being connected in common to a first power supply lead connected to a first power supply voltage;
   an output node connected to said second lead of said second load device;
   a non-inverting input transistor having a first lead connected to said second lead of said first load device, a second lead serving as a non-inverting input lead, and a third lead;
   an inverting input transistor having a first lead connected to said second lead of said second load device, a second lead serving as the inverting input lead, and a third lead connected in common with said third lead of said inverting input transistor to a second power supply voltage lead;
   a capacitor having a first and a second plate;
   first switch means connected between said first power supply voltage and said first plate of said capacitor;
   second switch means connected between a second power supply voltage and said second plate of said capacitor;
   third switch means connected between said second power supply voltage and said first plate of said capacitor;
   fourth switch means connected between said second power supply lead and said second plate of said capacitor;
   wherein said first and said second switch means are closed and said third and fourth switch means are open during a first clock phase of a two phase non-overlapping clock signal, thereby causing said capacitor to be charged between said first power supply voltage and said second power supply voltage and said first and said second switch means are open and said third and said fourth switch means are closed during a second clock phase of said two phase non-overlapping clock signal, thereby applying the negative of the voltage stored on said capacitor during said first clock phase to said second power supply lead.

2. Structure as in claim 1 further comprising:
   a second capacitor having a first and a second plate;
   fifth switch means connected between said first power supply voltage and said first plate of said second capacitor;
   sixth switch means connected between said second power supply voltage and said second plate of said second capacitor;
   seventh switch means connected between said second power supply voltage and said first plate of said second capacitor; and,
   eighth switch means connected between said second power supply lead and said second plate of said second capacitor;
   wherein said fifth and said sixth switch means are closed, and said seventh and said eighth switch means are open during said second clock phase, thereby causing said second capacitor to be charged between said first power supply voltage and said second power supply voltage, and said seventh and said eighth switch means are closed and said fifth and said sixth switch means are open during said said first clock phase, thereby applying the negative of the voltage stored on said second capacitor during said second clock phase to said second power supply lead.

3. Structure as in claims 1 or 2 wherein said load devices are MOSFET devices having source leads serving as said first leads of said load devices, drain leads serving as said second leads of said load devices, and gate leads connected in common to said drain lead of said second load device.

4. Structure as in claims 1 or 2 wherein said inverting input transistor and said non-inverting input transistor are MOSFET devices.

5. Structure as in claim 3 wherein said inverting input transistor and said non-inverting input transistor are MOSFET devices.

6. Structure as in claims 1 or 2 wherein said switch means comprise MOSFET devices.

7. Structure as in claim 3 wherein said switch means comprise MOSFET devices.

8. Structure as in claim 4 wherein said switch means comprise MOSFET devices.

9. Structure as in claim 5 wherein said switch means comprise MOSFET devices.

10. The method of biasing a dynamic operational amplifier having a first lead connected to a first voltage supply and a second lead for connection to a biasing means, comprising:
    connecting the first plate of a first storage capacitor to said first voltage supply and connecting said second plate of said first storage capacitor to a second voltage supply, thereby charging said first storage capacitor; and
    connecting said first plate of said first storage capacitor to said second voltage supply and connecting said second plate of said first storage capacitor to said second lead;
    whereby the voltage applied across said first lead and said second lead is equal to twice the voltage difference between said first and said second voltage supplies.

11. The method as in claim 10 wherein the first plate of a second storage capacitor is connected to said first voltage supply and said second plate of said second storage capacitor is connected to said second voltage supply, thereby charging said seconds storage capacitor, when said first storage capacitor is connected to said second lead; and
    said first plate of said second storage capacitor is connected to said second voltage supply and said second plate of said second storage capacitor is connected to said second lead when said first storage capacitor is connected to said first and second supply voltages;
    whereby said second lead is always connected to either said first storage capacitor or said second storage capacitor.

* * * * *

UNITED STATES PATENT AND TRADEMARK OFFICE
CERTIFICATE OF CORRECTION

PATENT NO. : 4,431,971
DATED : February 14, 1984
INVENTOR(S) : Yusuf A. Haque

It is certified that error appears in the above—identified patent and that said Letters Patent is hereby corrected as shown below:

Column 3, line 8, change the second "∅" to --∅̄-- .

Signed and Sealed this

Twenty-second Day of May 1984

[SEAL]

*Attest:*

GERALD J. MOSSINGHOFF

*Attesting Officer*     *Commissioner of Patents and Trademarks*